(12) United States Patent
Forrest et al.

(10) Patent No.: US 11,094,902 B2
(45) Date of Patent: Aug. 17, 2021

(54) HIGH EFFICIENCY SMALL MOLECULE TANDEM PHOTOVOLTAIC DEVICES

(71) Applicant: The Regents of the University of Michigan, Ann Arbor, MI (US)

(72) Inventors: Stephen R. Forrest, Ann Arbor, MI (US); Xiaozhou Che, Ann Arbor, MI (US); Xin Xiao, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 15/030,152

(22) PCT Filed: Oct. 27, 2014

(86) PCT No.: PCT/US2014/062354
§ 371 (c)(1),
(2) Date: Apr. 18, 2016

(87) PCT Pub. No.: WO2015/061774
PCT Pub. Date: Apr. 30, 2015

(65) Prior Publication Data
US 2016/0254470 A1    Sep. 1, 2016

Related U.S. Application Data

(60) Provisional application No. 61/924,577, filed on Jan. 7, 2014, provisional application No. 61/895,837, filed on Oct. 25, 2013.

(51) Int. Cl.
*H01L 51/42* (2006.01)
*H01L 51/44* (2006.01)
(Continued)

(52) U.S. Cl.
CPC ........ *H01L 51/424* (2013.01); *H01L 51/0056* (2013.01); *H01L 51/0061* (2013.01);
(Continued)

(58) Field of Classification Search
CPC ............... H01L 51/424; H01L 51/0056; H01L 51/0061; H01L 51/0071; H01L 51/4253; H01L 51/442
(Continued)

(56) References Cited

U.S. PATENT DOCUMENTS

2006/0027802 A1* 2/2006 Forrest .................. B82Y 10/00
257/40
2013/0104968 A1* 5/2013 Pfeiffer ................. H01L 27/302
136/255
2016/0254101 A1* 9/2016 Forrest ............... H01L 51/4273
136/256

FOREIGN PATENT DOCUMENTS

WO   WO 2013/123039         8/2013
WO   WO 2014/169270 A2     10/2014
WO   WO 2015/061772 A1      4/2015

OTHER PUBLICATIONS

Chen et al., Vacuum-Deposited Small-Molecule Organic Solar Cells with High Power Conversion Efficiencies by Judicious Molecule Design and Device Optimization, Journal of the American Chemical Society, vol./Issue 134, pp. 13616-13623 (2012).*
(Continued)

*Primary Examiner* — Jayne L Mershon
(74) *Attorney, Agent, or Firm* — Finnegan, Henderson, Farabow, Garrett & Dunner, LLP

(57) ABSTRACT

A high efficiency small molecule tandem solar cell is disclosed. The tandem cell may include a first subcell comprising a first photoactive region and a second subcell comprising a second photoactive region. The first and second photoactive regions are designed to minimize spectral overlap and maximize photocurrent. The device may further include an interconnecting layer, disposed between the first subcell and the second subcell, that is at least substantially transparent.

11 Claims, 21 Drawing Sheets

(51) Int. Cl.
*H01L 51/00* (2006.01)
*H01L 27/30* (2006.01)

(52) U.S. Cl.
CPC ...... *H01L 51/0071* (2013.01); *H01L 51/4253* (2013.01); *H01L 51/442* (2013.01); *H01L 27/302* (2013.01); *H01L 51/0046* (2013.01); *H01L 51/0047* (2013.01); *H01L 51/0068* (2013.01); *H01L 51/0072* (2013.01); *H01L 51/4246* (2013.01); *H01L 51/4273* (2013.01); *Y02E 10/549* (2013.01)

(58) Field of Classification Search
USPC .......................................................... 136/263
See application file for complete search history.

(56) References Cited

OTHER PUBLICATIONS

Lee et al., Sensitization of the photoconductivity of conducting polymers by C60: Photoinduced electron transfer, Physical Review B, The American Physical Society, vol. 48, No. 20, pp. 15 425-15 433 (1993).*
International Search Report dated Jan. 21, 2015, PCT/US2014/062354.
Chen et al., "Vacuum-Deposited Small-Molecule Organic Solar Cells with High Power Conversion Efficiences by Judicious Molecular Design and Device Optimization," *Journal of the American Chemical Society*, vol. 134, No. 33, pp. 13616-13623, Jun. 26, 2012.
Chang et al., "Charge Carrier Dynamics of Vapor-Deposited Small-Molecule/Fullerence Organic Solar Cells," *Journal of the American Chemical Society*, vol. 135, No. 24, May 29, 2013.
Bartynski et al., "A Fullerene-Based Organic Exciton Blocking Layer with High Electron Conductivity," NANO Letters, vol. 13, No. 7, pp. 3315-3320 (Jun. 10, 2013).

* cited by examiner

HIGH EFFICIENCY SMALL MOLECULE TANDEM PHOTOVOLTAIC DEVICES

CROSS-REFERENCE TO RELATED APPLICATION

This application claims the benefit of U.S. Provisional Application No. 61/895,837, filed Oct. 25, 2013, and U.S. Provisional Application No. 61/924,577, filed Jan. 7, 2014, both of which are incorporated herein by reference in their entirety.

STATEMENT REGARDING FEDERALLY SPONSORED RESEARCH

This invention was made with U.S. Government support under Contract Nos. DE-EE0005310 and DE-SC0000957 awarded by the U.S. Department of Energy. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and NanoFlex Power Corporation. The agreement was in effect on and before the date the subject matter of the present disclosure was prepared, and was made as a result of activities undertaken within the scope of the agreement.

The present disclosure generally relates to electrically active, optically active, solar, and semiconductor devices and, in particular, to high efficiency small molecule tandem photovoltaic devices.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices or cells, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with the specific applications requirements.

Traditionally, photosensitive optoelectronic devices have been constructed of a number of inorganic semiconductors, e.g., crystalline, polycrystalline and amorphous silicon, gallium arsenide, cadmium telluride, and others.

PV devices may be characterized by the efficiency with which they can convert incident solar power to useful electric power. Devices utilizing crystalline or amorphous silicon dominate commercial applications. However, efficient crystalline-based devices, especially of large surface area, are difficult and expensive to produce due to the problems inherent in producing large crystals without significant efficiency-degrading defects. On the other hand, high efficiency amorphous silicon devices still suffer from problems with stability. Present commercially available amorphous silicon cells have stabilized efficiencies between 4% and 8%.

PV devices may be optimized for maximum electrical power generation under standard illumination conditions (i.e., Standard Test Conditions which are 1000 W/m$^2$, AM 1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes, (2) the photovoltage under open circuit conditions, i.e., the open circuit voltage $V_{OC}$, in Volts, and (3) the fill factor, FF.

$I_{SC}$ is often listed alternatively as $J_{SC}$, the short circuit current density, in mA/cm$^2$, to remove the dependency of the value on the area of the solar cell. Accordingly, $I_{SC}$ can be readily converted to or derived from $J_{SC}$ by dividing by or multiplying by, respectively, the area of the PV device.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, VI. The maximum total power generated by a PV device is inherently incapable of exceeding the product, $I_{SC}V_{OC}$. When the load value is optimized for maximum power extraction, the current and voltage have the values, $I_{MAX}$ and $V_{MAX}$ respectively.

A figure of merit for PV devices is the fill factor, FF, defined as:

$$FF = (I_{MAX}V_{MAX})/(I_{SC}V_{OC})$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF(I_{SC}V_{OC})/P_{inc}$$

To produce internally generated electric fields that occupy a substantial volume of the semiconductor, the usual method is to juxtapose two layers of material (donor and acceptor) with appropriately selected conductive properties, especially with respect to their distribution of molecular quantum energy states. The interface of these two materials is called a photovoltaic junction. In traditional semiconductor theory, materials for forming PV junctions have been denoted as generally being of either n or p type. Here n-type denotes that the majority carrier type is the electron. This could be viewed as the material having many electrons in relatively free energy states. The p-type denotes that the majority carrier type is the hole. Such material has many holes in relatively free energy states. The type of the background, i.e., not photo-generated, majority carrier concentration depends primarily on unintentional doping by defects or impurities. The type and concentration of impurities determine the value of the Fermi energy, or level, within the gap between the conduction band minimum and valance band maximum energies, also known as the HOMO-LUMO gap. The Fermi energy characterizes the statistical occupation of molecular quantum energy states denoted by the value of energy for which the probability of occupation is equal to ½. A Fermi energy near the conduction band minimum (LUMO) energy indicates that electrons are the predominant carrier. A Fermi energy near the valence band maximum (HOMO) energy indicates that holes are the predominant carrier. Accordingly, the Fermi energy is a primary characterizing property of traditional semiconductors and the prototypical PV junction has traditionally been the p-n interface.

Conventional inorganic semiconductor PV cells may employ a p-n junction to establish an internal field. However, it is now recognized that in addition to the establishment of a p-n type junction, the energy level offset of the heterojunction also plays an important role.

The energy level offset at an organic donor-acceptor (D-A) heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a D-A interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Carrier generation requires exciton generation, diffusion, and ionization or collection. There is an efficiency η associated with each of these processes. The diffusion length ($L_D$) of an exciton is typically much less ($L_D$~50 Å) than the optical absorption length (~500 Å), requiring a tradeoff between using a thick, and therefore resistive, cell with multiple or highly folded interfaces, or a thin cell with a low optical absorption efficiency.

More recent efforts have focused on the use of organic photovoltaic (OPV) cells to achieve acceptable photovoltaic conversion efficiencies with economical production costs. OPVs offer a low-cost, light-weight, and mechanically flexible route to solar energy conversion. Compared with polymers, small molecule OPVs share the advantage of using materials with well-defined molecular structures and weights. This leads to a reliable pathway for purification and the ability to deposit multiple layers using highly controlled thermal deposition without concern for dissolving, and thus damaging, previously deposited layers or subcells.

Single-junction small molecule OPVs have achieved a power conversion efficiency of >8%, but the narrow absorption range, low $V_{OC}$, and large thermalization energy losses at short wavelengths ultimately limit the power conversion efficiencies of single element OPVs. This shortcoming has led to the investigation tandem cell OPVs whose design can allow for more complete coverage of the solar spectrum while maintaining a high $V_{OC}$.

In particular, Tandem solar cells have been studied as a means to increase the spectral coverage and efficiency of OPVs. Most of these tandem cell OPVs have been made with polymer materials or solutions based fabrication processes. Polymer tandem photovoltaic cells have already demonstrated a power conversion efficiency of $\eta_P$=10.6%. Similar high efficiency small molecule cells have not yet been demonstrated.

In previously developed small molecule tandem cells, current is limited by the front near infrared (NIR)-absorbing subcell that also absorbs shorter wavelength photons, preventing those photons from reaching the back subcell. These tandem cells may still deliver high efficiency, however, since the sub cells are sufficiently thin, owing to the short exciton diffusion length ($L_D$~10 nm) characteristic of a small molecule active region, to remain semi-transparent. To mitigate the problem of short diffusion length, vacuum deposited planar-mixed heterojunction (PM-HJ) active regions have been used in which the donor and the acceptor molecules are mixed in the active region. The PM-HJ is not limited by $L_D$ but rather the much larger charge collection length. Thus the photoactive region is thickened to enhance optical absorption without compromising cell efficiency. To further reduce biomolecular recombination at mixed layer interfaces while increasing absorption, a PM-HJ may also employ a neat donor and/or acceptor layer with a thickness comparable to $L_D$ adjacent to the mixed region.

Unfortunately, such thick and highly absorbing subcells typically result in spectral overlaps between elements in the tandem, ultimately limiting photocurrent.

Additionally, tandem cells generally include one or more layers separating the constituent subcells. Such layers may require certain qualities, such as sufficient conductivity, transparency, surface roughness, and mechanical and chemical stability. In particular, these layers must be deposited in a manner as not to affect the already deposited subcell and must be sufficiently stable to withstand the deposition of the yet to be deposited layers. Previously used separating layers have also suffered from low charge recombination efficiency, which ideally should be near unity, and high absorption characteristics, which reduce the amount of electromagnetic radiation that reaches the back subcell. For instance, conventional use of PTCBI results in significant absorption loss in the visible spectrum.

SUMMARY OF THE INVENTION

Accordingly, it is an object of the present invention to provide a tandem solar cell with high photovoltaic conversion efficiencies.

Another object of the present invention is to provide a solar cell with an economical production cost.

It is a further object of the present invention to use relatively thick and strongly absorbing subcells with considerable separation between their absorption maxima to minimize spectral overlap and maximize photocurrent.

It is another object of the present invention to use materials that minimize optical absorption by layers disposed between subcells.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

Thus, disclosed herein are novel high efficiency small molecule tandem photovoltaic devices.

To achieve the objects and in accordance with the purpose of the invention, as embodied and broadly described herein, the invention includes a tandem photovoltaic device comprising: a first subcell comprising a first photoactive region;

and a second subcell comprising a second photoactive region; wherein: the first photoactive region comprises a first donor material and a first acceptor material forming a first donor-acceptor heterojunction; the second photoactive region comprises a second donor material and a second acceptor material forming a second donor-acceptor heterojunction; the first donor material comprises 2-((7-(5-(dip-tolylamino)thiophen-2-yl)benzo[c][1,2,5]thiadiazol-4-yl)methylene)malononitrile ("DTDCTB") or a derivative thereof; and the second donor material comprises a material chosen from dibenzo([f,f']-4,4',7,7'-tetraphenyl)diindeno[1,2,3-cd:1',2',3'-lm]perylene ("DBP"), (2-[(7-{4-[N,N-Bis(4-methylphenyl)amino]phenyl}-2,1,3-benzothiadiazol-4-yl)methylene]propanedinitrile ("DTDCPB"), and a derivative thereof.

To achieve a further object of the invention, the tandem photovoltaic device may include a separating layer disposed between the first subcell and the second subcell. In some embodiments, the separating layer comprises an interconnecting layer comprising a mixture of a wide energy gap material and either an electron conducting material or a hole conducting material.

It is to be understood that both the foregoing general description and the following detailed description are exemplary and explanatory only and are not restrictive of the invention, as claimed.

BRIEF DESCRIPTION OF THE DRAWINGS

The accompanying figures, which are incorporated in and constitute a part of this specification, illustrate several embodiments of the invention and together with the description, serve to explain the principles of the invention.

Figure 1:
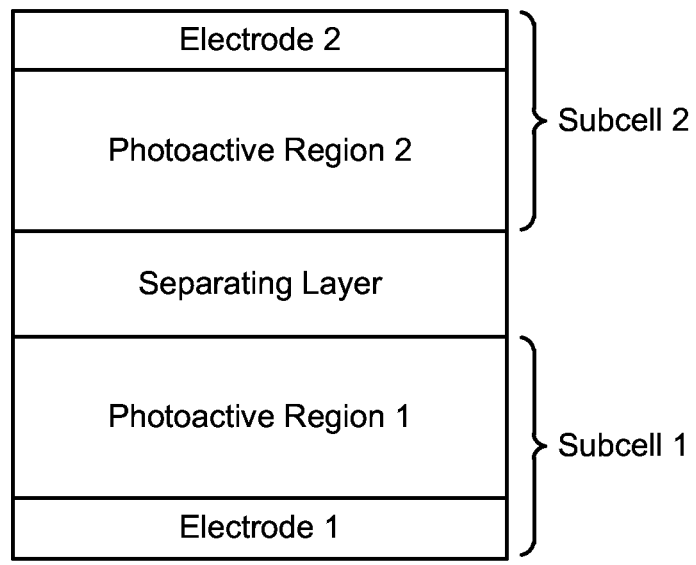
FIG. 1 shows a block diagram of an exemplary tandem photovoltaic device according to the present disclosure.

The terms "electrode" and "contact" are used herein to refer to a layer that provides a medium for delivering photo-generated current to an external circuit or providing a bias current or voltage to the device. That is, an electrode, or contact, provides the interface between the active regions of an organic photosensitive optoelectronic device and a wire, lead, trace or other means for transporting the charge carriers to or from the external circuit. Anodes and cathodes are examples. U.S. Pat. No. 6,352,777, incorporated herein by reference for its disclosure of electrodes, provides examples of electrodes, or contacts, which may be used in a photosensitive optoelectronic device.

In a photosensitive optoelectronic device, it may be desirable to allow the maximum amount of ambient electromagnetic radiation from the device exterior to be admitted to the photoconductive active interior region. That is, the electromagnetic radiation must reach a photoconductive layer(s), where it can be converted to electricity by photoconductive absorption. This often dictates that at least one of the electrical contacts should be minimally absorbing and minimally reflecting of the incident electromagnetic radiation. In some cases, such a contact should be transparent or at least semi-transparent. An electrode is said to be "transparent" when it permits at least 50% of the incident electromagnetic radiation in relevant wavelengths to be transmitted through it. An electrode is said to be "semi-transparent" when it permits some, but less than 50% transmission of ambient electromagnetic radiation in relevant wavelengths. The opposing electrode may be a reflective material so that light which has passed through the cell without being absorbed is reflected back through the cell.

As used and depicted herein, a "layer" refers to a member or component of a photosensitive device whose primary dimension is X-Y, i.e., along its length and width. It should be understood that the term layer is not necessarily limited to single layers or sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

As used herein, a "photoactive region" refers to a region of the device that absorbs electromagnetic radiation to generate excitons. Similarly, a layer is "photoactive" if it absorbs electromagnetic radiation to generate excitons. The excitons may dissociate into an electron and a hole in order to generate an electrical current.

In the context of the organic materials of the present disclosure, the terms "donor" and "acceptor" refer to the relative positions of the HOMO and LUMO energy levels of two contacting but different organic materials. If the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

Disclosed herein is a tandem photovoltaic device comprising: a first subcell comprising a first photoactive region; and a second subcell comprising a second photoactive region; wherein: the first photoactive region comprises a first donor material and a first acceptor material forming a first donor-acceptor heterojunction; the second photoactive region comprises a second donor material and a second acceptor material forming a second donor-acceptor heterojunction; the first donor material comprises DTDCTB or a derivative thereof; and the second donor material comprises a material chosen from DBP and DTDCPB, and a derivative thereof. An example device schematic according to the present disclosure is shown in FIG. 1.

Accordingly, a subcell, as used herein, means a component of the device which comprises at least one donor-acceptor heterojunction. The donor-acceptor heterojunction may be chosen from those known in the art, such as a planar heterojunction, a bulk heterojunction, a mixed heterojunction, and a hybrid planar-mixed heterojunction. In certain embodiments, the first donor-acceptor heterojunction is a mixed heterojunction or a hybrid planar-mixed heterojunction. In certain embodiments, the second donor-acceptor heterojunction is a mixed heterojunction or a hybrid planar-mixed heterojunction. In certain embodiments, the first and second donor-acceptor heterojunctions are chosen from mixed heterojunctions and hybrid planar-mixed heterojunctions.

When a subcell is used individually as a photosensitive optoelectronic device, it typically includes a complete set of electrodes. In a tandem photovoltaic device, such as those of the present disclosure and as shown in FIG. 1, each subcell may include an electrode, and the subcells may be divided by a separating layer. As known in the art for tandem devices, the separating layer may comprise at least one charge transfer layer, at least one electrode, or at least one charge recombination layer. In some tandem configurations, it is possible for the subcells to utilize a common, i.e., shared, electrode, charge transfer layer or charge recombination layer. In other cases, the subcells do not share common electrodes or charge transfer layers. The subcells may be electrically connected in parallel or in series.

In some embodiments, the charge transfer layer or charge recombination layer may be chosen from Al, Ag, Au, $MoO_3$, Li, LiF, Sn, Ti, WO3, indium tin oxide (ITO), tin oxide (TO), gallium indium tin oxide (GITO), zinc oxide (ZO), or zinc indium tin oxide (ZITO). In some embodiments, the charge transfer layer or charge recombination layer may comprise metal nanoclusters, nanoparticles, or nanorods. In some embodiments, the charge recombination layer comprises a thin metal layer. In certain embodiments, the charge recombination layer is less than or equal to about 20 Å thick, such as, for example, less than or equal to about 15 Å, 10 Å, or 5 Å thick. The small thickness can allow light to reach the back subcell.

One of the electrodes of the present disclosure may be an anode, and the other electrode a cathode. It should be understood that the electrodes should be optimized to receive and transport the desired carrier (holes or electrons). The term "cathode" is used herein such that in a non-stacked PV device or a single unit of a stacked PV device under ambient irradiation and connected with a resistive load and with no externally applied voltage, e.g., a PV device, electrons move to the cathode from the photo-conducting material. Similarly, the term "anode" is used herein such that in a PV device under illumination, holes move to the anode from the photoconducting material, which is equivalent to electrons moving in the opposite manner.

Figure 3A:
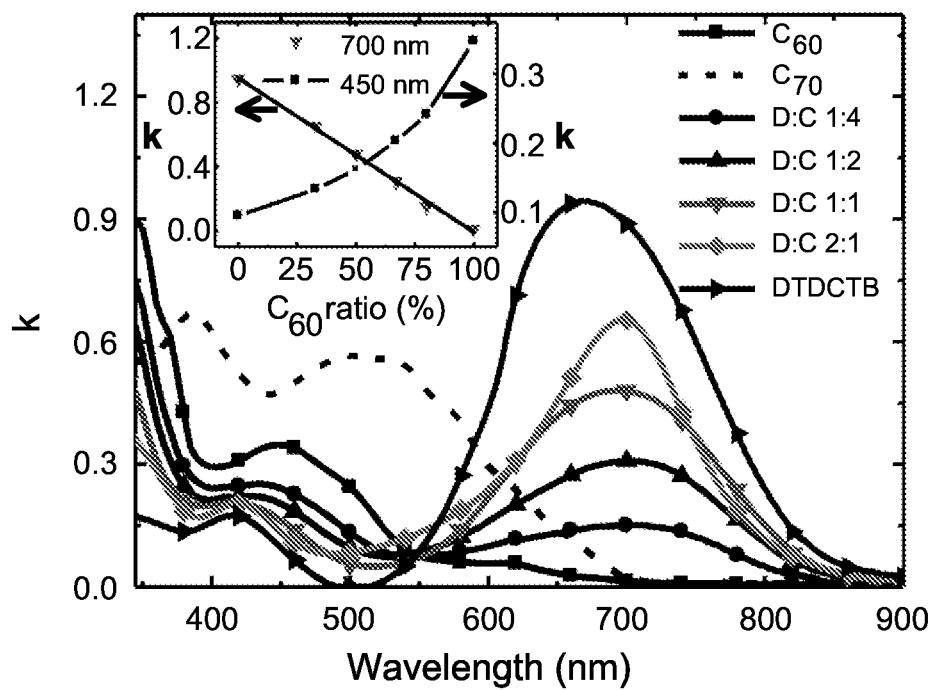
FIG. 3A shows the extinction coefficients (k) of DTDCTB:$C_{60}$ films measured as functions of volume ratio. The inset shows a plot of k at $\lambda$=450 nm and $\lambda$=700 nm as a function of the $C_{60}$ percentage.
Figure 3B:
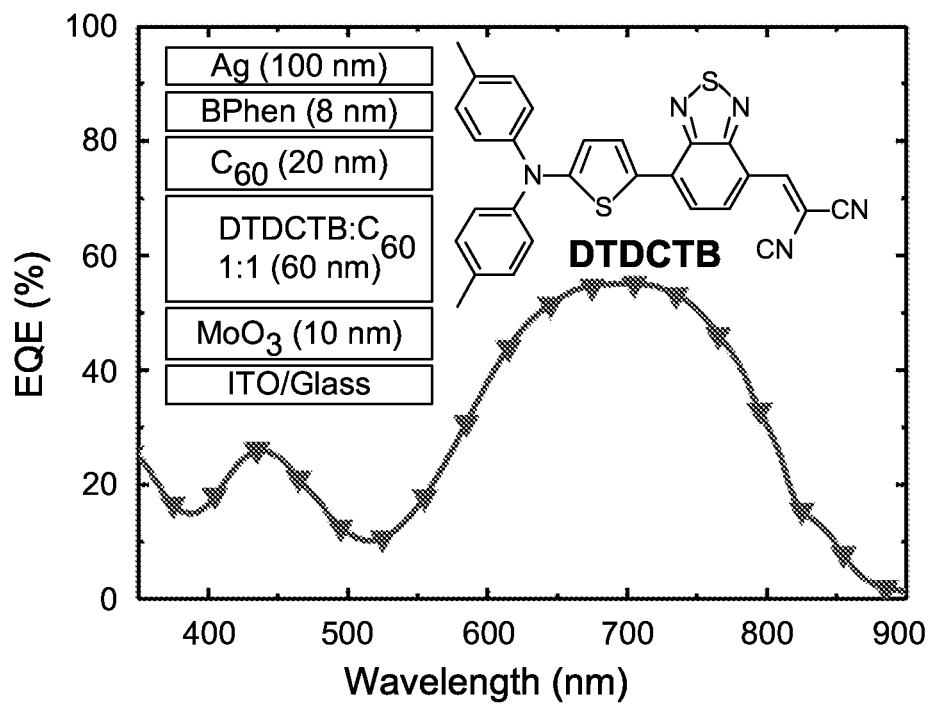
FIG. 3B shows the EQE of an optimized DTDCTB:$C_{60}$ cell. The inset shows the structure of the optimized cell and the chemical structure of DTDCTB.
Figure 10:
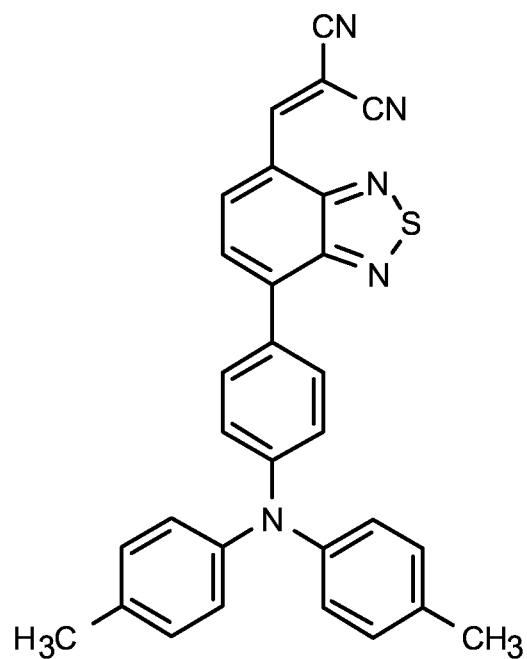
FIG. 10 shows the chemical structure of DTDCPB.

As described above, the first donor material in the first subcell comprises DTDCTB, the molecular structure of which is shown in FIG. 3B, or a derivative thereof. DTDCTB primarily absorbs in the orange-to-NIR spectral region. The second donor material in the second subcell is chosen from DBP, DTDCPB and a derivative thereof. The structure of DTDCPB is shown in FIG. 10. DBP and DTDCPB absorb primarily in the green spectral region. Thus, DTDCTB in the first subcell, and DBP or DTDCPB in the second subcell show considerable separation between their absorption maxima, thereby minimizing spectral overlap and maximizing photocurrent.

The first and second acceptor materials may be chosen from suitable materials known in the art. Examples of suitable acceptor materials include but are not limited to perylenes, naphthalenes, fullerenes, and fullerene derivatives (e.g., PCBMs, ICBA, ICMA, etc.). Non-limiting mention is made to those chosen from $C_{60}$, $C_{70}$, $C_{76}$, $C_{82}$, $C_{84}$, or derivatives thereof such as Phenyl-$C_{61}$-Butyric-Acid-Methyl Ester ([60]PCBM), Phenyl-$C_{71}$-Butyric-Acid-Methyl Ester ([70]PCBM), or Thienyl-$C_{61}$-Butyric-Acid-Methyl Ester ([60]ThCBM), and other acceptors such as 3,4,9,10-perylenetetracarboxylic-bisbenzimidazole (PTCBI), hexadecafluorophthalocyanine ($F_{16}$CuPc), and derivatives thereof. Suitable acceptor materials may be chosen to be consistent with the desire of the present disclosure to minimize spectral overlap and maximize photocurrent.

In some embodiments, the first acceptor material and the second acceptor material each comprise a material independently chosen from fullerenes and derivatives thereof. In some embodiments, the fullerenes are chosen from $C_{60}$ and $C_{70}$. In certain embodiments, the first acceptor material comprises $C_{60}$. In certain embodiments, the second acceptor material comprises $C_{70}$. In certain embodiments, the first acceptor material comprises $C_{60}$ and the second acceptor material comprises $C_{70}$. In certain embodiments, the second donor material comprises DBP and the second acceptor material comprises $C_{70}$.

In some embodiments of the present tandem devices, either the first subcell or the second subcell may act as the front subcell or the back subcell. The front subcell and the back subcell are used herein in the following manner: light enters the device through the front subcell and light that is not absorbed by the front subcell is passed to the back subcell. In certain embodiments, the front subcell may be provided with an electrode (anode or cathode as the case may be) that is substantially transparent in order to allow light to pass into the tandem cell. In some embodiments, the back subcell may be provided with a reflective electrode in order to allow incident light to be reflected back through the tandem device.

In some embodiments, the first subcell is the front subcell. In certain of these embodiments, the first acceptor material is $C_{60}$. In certain of these embodiments, the first acceptor material is $C_{60}$ and the second acceptor material is $C_{70}$. In some embodiments, the first subcell comprises an anode, and the second subcell comprises a cathode.

The subcells of the present disclosure may further comprise additional layers known in the art for photovoltaic devices. For example, the subcells may further comprise buffers layers, such as one or more charge collection/transporting layers and/or one or more blocking layers, such as exciton blocking layers (EBLs).

With regard to materials that may be used as an exciton blocking layer, non-limiting mention is made to those chosen from bathocuproine (BCP), bathophenanthroline (BPhen), 1,4,5,8-Naphthalene-tetracarboxylic-dianhydride (NTCDA), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (Ru(acac)3), and aluminum(III)phenolate (Alq2 OPH), N,N'-diphenyl-N,N'-bis-alpha-naphthylbenzidine (NPD), aluminum tris(8-hydroxyquinoline) (Alq3), and carbazole biphenyl (CBP). Examples of blocking layers are described in U.S. Patent Publication Nos. 2012/0235125 and 2011/0012091 and in U.S. Pat. Nos. 7,230,269 and 6,451,415, which are incorporated herein by reference for their disclosure of blocking layers.

In some embodiments, one or more blocking layers are located between an electrode and one of the photoactive regions. In some embodiments, one or more blocking layers are located between each of the photoactive regions and the corresponding electrodes.

In some embodiments, one or more charge collecting/transporting layers are located between an electrode and one of the photoactive regions. In some embodiments, one or more charge collecting/transporting layers are located between each of the photoactive regions and the corresponding electrodes. In some embodiments, one or more charge collecting/transporting layers are located between the separating layer and one or both of the photoactive regions. In certain embodiments, the charge collecting/transporting layers comprise a material chosen from metal oxides. In certain embodiments, the metal oxides are chosen from $MoO_3$, $V_2O_5$, ZnO, and $TiO_2$ In addition, the tandem devices may further comprise at least one smoothing layer.

As discussed above, and as shown in FIG. 1, the first and second subcells may be divided by a separating layer. The separating layer may comprise at least one charge transfer layer, at least one electrode, or at least one charge recombination layer.

In some embodiments, the separating layer further comprises an interconnecting layer. The interconnecting layer may comprise a mixture of a wide energy gap material and either an electron conducting material or a hole conducting material. The wide energy gap material will block excitons while the electron conducting material or hole conducting material will transport electrons or holes, respectively. For example, in an exemplary optimized tandem device according to the present disclosure, shown in FIG. 11, the separating layer comprises a thin Ag layer (0.1 nm) (i.e., the charge recombination layer) and an interconnecting layer. In this particular embodiment, the interconnecting layer comprises a mixture of BPhen and $C_{60}$. BPhen constitutes the wide energy gap material and blocks excitons, and $C_{60}$ is an electron conducting material and transports electrons to the charge recombination layer.

Figure 11:
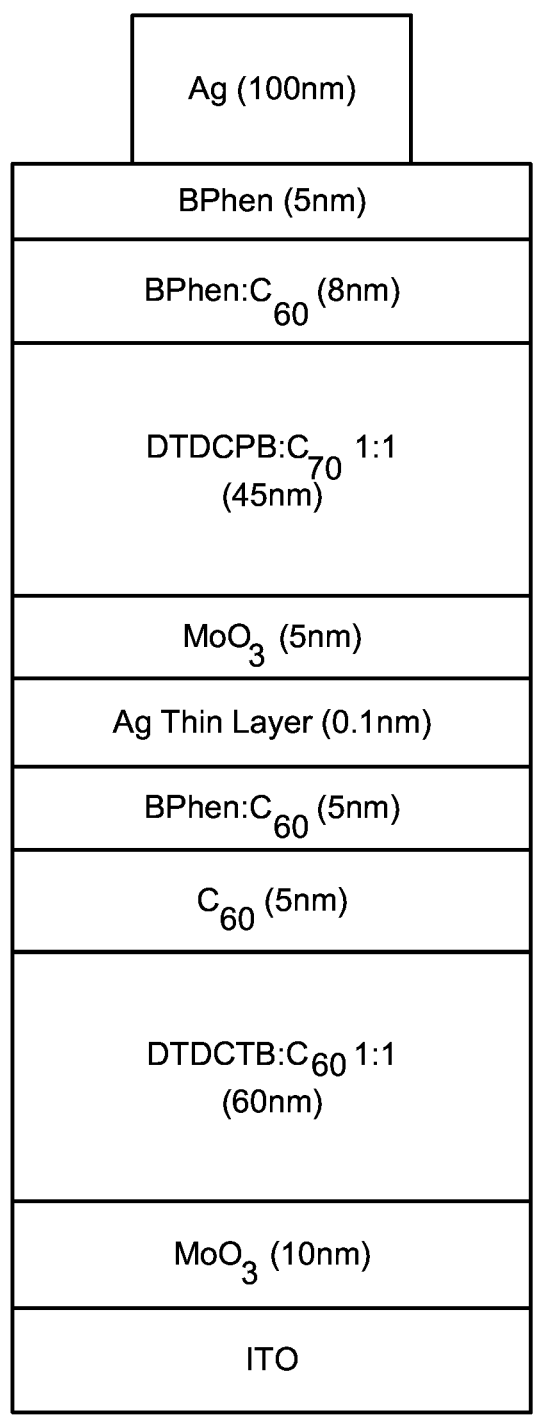
FIG. 11 shows an exemplary tandem device according to Example 3.

Thus, the wide energy gap material should have a HOMO-LUMO energy gap larger than the HOMO-LUMO gap of the nearest photoactive material, which in the particular embodiment of FIG. 11 is the acceptor $C_{60}$. The electron conducting material should have a LUMO energy level equal to or lower than the LUMO energy level of the nearest photoactive material, which in the particular embodiment of FIG. 11 is the acceptor $C_{60}$. In some embodiments, the electron conducting material comprises the same material as the nearest acceptor material. Thus, electron conducting materials may be chosen from the acceptor materials described herein and as known in the art. In a device configuration where a hole conducting material is appropriate, the hole conducting material should have a HOMO energy level higher than the HOMO energy level of the nearest photoactive material. In some embodiments, the hole conducting material comprises the same material as the nearest donor material.

Suitable wide energy gap materials include, but are not limited to, bathocuproine (BCP), bathophenanthroline (BPhen), p-Bis(triphenylsilyl)benzene (UGH-2), (4,4'-N,N'-dicarbazole)biphenyl (CBP), N,N'-dicarbazolyl-3,5-benzene (mCP), poly(vinylcarbazole) (PVK), phenanthrene and alkyl and/or aryl substituted phenanthrenes, alkyl and/or aryl substituted derivatives of benzene, triphenylene and alkyl and/or aryl substituted triphenylenes, aza-substituted triphenylenes, oxidiazoles, triazoles, aryl-benzimidazoles, adamantane and alkyl and/or aryl substituted adamantanes, tetraarylmethane and its derivatives, 9,9-dialkyl-fluorene and its oligomers, 9,9-diaryl-fluorene and its oligomers, spiro-biphenyl and substituted derivatives, corannulene and its alkyl and/or aryl substituted derivatives, and derivatives thereof.

It is also advantageous for the interconnecting layer to be substantially transparent, or ideally entirely transparent, across the spectral region absorbed by the subcells, so as to permit as much relevant light as possible to pass from the front subcell to the back subcell. By mixing a transparent wide energy gap material with either an electron conducting material or a hole conducting material, the electron or hole conducting material may be sufficiently diluted, rendering the interconnecting layer transparent or substantially transparent at relevant wavelengths resulting in improved device performance.

Layers and materials may be deposited using techniques known in the art. For example, the layers and materials described herein can be deposited or co-deposited from a solution, vapor, or a combination of both. In some embodiments, organic materials or organic layers are deposited or co-deposited using vacuum evaporation, such as vacuum thermal evaporation, organic vapor phase deposition, or organic vapor-jet printing.

It should be understood that embodiments described herein may be used in connection with a wide variety of structures. Functional organic photovoltaic devices may be achieved by combining the various layers described in different ways, or layers may be omitted entirely, based on design, performance, and cost factors. Additional layers not specifically described may also be included. Materials other than those specifically described may be used. The names given to the various layers herein are not intended to be strictly limiting.

Other than in the examples, or where otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the disclosure are approximations, unless otherwise indicated the numerical values set forth in the specific examples are reported as precisely as possible. Any numerical value, however, inherently contains certain errors necessarily resulting from the standard deviation found in their respective testing measurements.

The devices and methods described herein will be further described by the following non-limiting examples, which are intended to be purely exemplary.

Example 1: DTDCTB:$C_{60}$ and DBP:$C_{70}$ Subcells

Materials and device fabrication. Devices were grown on indium tin oxide (ITO) coated glass substrates. Prior to use, DTDCTB, DBP, $C_{60}$, and $C_{70}$ were purified once using temperature-gradient sublimation. The ITO surface was cleaned in a series of detergents and solvents and treated with ultraviolet (UV)-ozone for 10 min before thin film deposition. Neat films were deposited using vacuum thermal evaporation in a chamber with a base pressure of $\sim 10^{-7}$ torr at a rate of 0.1 nm/2, except for the Ag nanoparticle charge recombination layer, which was deposited at 0.005 nm/s. The components of the DTDCTB:$C_{60}$ and BPhen:$C_{60}$ layers were co-deposited at 0.1 nm/s with the rate for each material adjusted to achieve the desired volume ratio. The components of DBP:$C_{70}$ were co-deposited at 0.2 nm/s. The growth rates and thicknesses were monitored using quartz crystal monitors and calibrated by ex situ variable-angle spectroscopic ellipsometry. The 100 nm thick Ag cathodes were deposited through a shadow mask with an array of circular, 1 mm diameter openings that defined the device areas.

Device characterization. Following cathode deposition, samples were transferred into a glove box filled with ultra-pure (<0.1 ppm) $N_2$ for testing. The current density-voltage (J-V) characteristics were measured at various incident light intensities using AM 1.5G solar illumination from a filtered Xe lamp, with intensities adjusted using neutral density filters. The intensity was measured using a National Renewable Energy Laboratory (NREL) traceable Si reference cell. The $J_{SC}$ and $\eta_P$ were corrected for spectral mismatch. The EQE was measured using monochromated light from a 200 Hz chopped Xe-lamp and calibrated with a NIST-traceable Si detector. Errors quoted correspond to device-to-device variations on the same substrate. The data for $J_{SC}$ and $\eta_P$ also include a systematic error of 5%.

Optical simulations. Structure optimization and device performance simulations were carried out based on the transfer-matrix approach with the calculation of exciton diffusion and carrier collection lengths as parameters. The real and imaginary indices of refraction, n and k, respectively, for 30 nm thin films deposited on silicon, were measured by ellipsometry (at wavelengths of 300-1600 nm) using the Cauchy model with Gaussian oscillators. To determine the optimal structure for current matching and efficiency for the tandems, the light intensity dependent J-V data from the constituent subcells was used. The mismatch factors M for the subcells were calculated from the measured EQE. For the tandem cell, this is obtained from the simulated power conversion efficiency $\eta_P$ with the simulator spectrum divided by the reference AM 1.5G 1 sun solar spectrum.

As embodied herein, a small molecule tandem solar cell was formed with a front subcell and a back subcell. The front subcell adjacent to the transparent anode comprised the primarily orange-to-NIR absorbing donor, 2-({7-(5-{dip-tolylamino)thiophen-2-yl}benzo[c][1,2,5]thiadiazol-4-yl) methylene)malononitrile (DTDCTB) blended with $C_{60}$ (together, DTDCTB:$C_{60}$). The front subcell was paired with a UV-to-yellow absorbing dibenzo{[f,f']-4,4',7,7'-tetraphenyl}diindeno[1,2,3-cd:1',2',3'-lm]perylene (DBP) mixed with $C_{70}$ (together, DBP:$C_{70}$) back subcell.

In the front subcell, the $C_{60}$ intermolecular charge transfer (CT) absorption feature in the green was greatly reduced when diluted in DTDCTB, thus providing a spectrally complimentary system with the back sub-cell. Both subcells had single junction efficiencies of ≥6.0% and were current matched in the stack. As a result, the tandem solar cell broadly covered the solar spectrum from $\lambda=350$ nm to 900 nm, achieving an efficiency of 10.0±0.5% under standard illumination. The high efficiency utilized the principle of non-overlapping spectral sensitivity between subcells that is unique to excitonic cells, along with a nearly optically lossless BPhen:$C_{60}$ electron filtering layer connecting the subcells.

To determine the characteristics of the front subcell, a single junction DTDCTB:$C_{60}$ cell was formed. The low band gap DTDCTB absorbs at wavelengths as long as $\lambda=900$ nm. To separate the front and back subcell absorption spectra, the blue-green absorbing $C_{60}$ was used as the acceptor, whereas the broadly absorbing $C_{70}$ was employed solely in the back subcell. The extinction coefficients (k) of the DTDCTB:$C_{60}$ films measured as functions of volume ratio are shown in FIG. 3A. The absorption of a neat $C_{70}$ film is also shown for comparison. The $C_{60}$ showed two peaks at $\lambda=360$ nm and $\lambda=450$ nm, corresponding to Frenkel-type and intermolecular CT excitations. The CT feature results from electrons excited from the HOMO of one molecule to the LUMO of a nearby $C_{60}$ molecule and is hence sensitive to $C_{60}$ concentration. In contrast, the intramolecular Frenkel transition absorption strength is proportional to the total number of $C_{60}$ molecules. The neat DTDCTB film exhibited a maximum absorption centered at $\lambda=700$ nm.

To analyze the Frenkel and CT absorption in the DTDCTB:$C_{60}$ mixed film, k at $\lambda=450$ nm and $\lambda=700$ nm as a function of the $C_{60}$ percentage was plotted in the inset of FIG. 3A. The DTDCTB Frenkel absorption peak at λ=700 nm linearly decreased with $C_{60}$ concentration, as expected. On the other hand, the $C_{60}$ CT peak at λ=450 nm was significantly reduced even at modest dilutions, eliminating losses caused by subcell absorption overlap from the green-absorbing feature as the fraction of $C_{60}$ was reduced.

An optimized DTDCTB:$C_{60}$ cell, shown in FIG. 3B, had the following structure: ITO/MoO$_3$ (10 nm)/DTDCTB:$C_{60}$ (60 nm, 1:1 ratio by vol.)/$C_{60}$ (20 nm)/BPhen (8 nm)/Ag (100 nm). The MoO$_3$ served as the anode buffer layer due to its large work function, high transmittance, and low resistance. The BPhen was used as the exciton blocking buffer layer adjacent to the cathode. The device exhibited $V_{OC}$=0.82±0.01 V, a short circuit current density of $J_{SC}$=13.7±0.7 mA/cm$^2$ (spectral mismatch factor of M=0.93±0.01), and FF=0.55±0.01. This corresponds to a power conversion efficiency of 6.2±0.3% at standard illumination. At this blend ratio, the CT absorption by $C_{60}$ was suppressed to only 40% of its value in the neat film. Accordingly, the DTDCTB:$C_{60}$ cell showed an external quantum efficiency of EQE>55% at λ=700 nm, falling off to <25% at λ<500 nm as shown in FIG. 3B. As further shown, this NIR absorbing front subcell has minimal spectral overlap with the principally green-absorbing DBP:$C_{70}$ back subcell.

Figure 2:
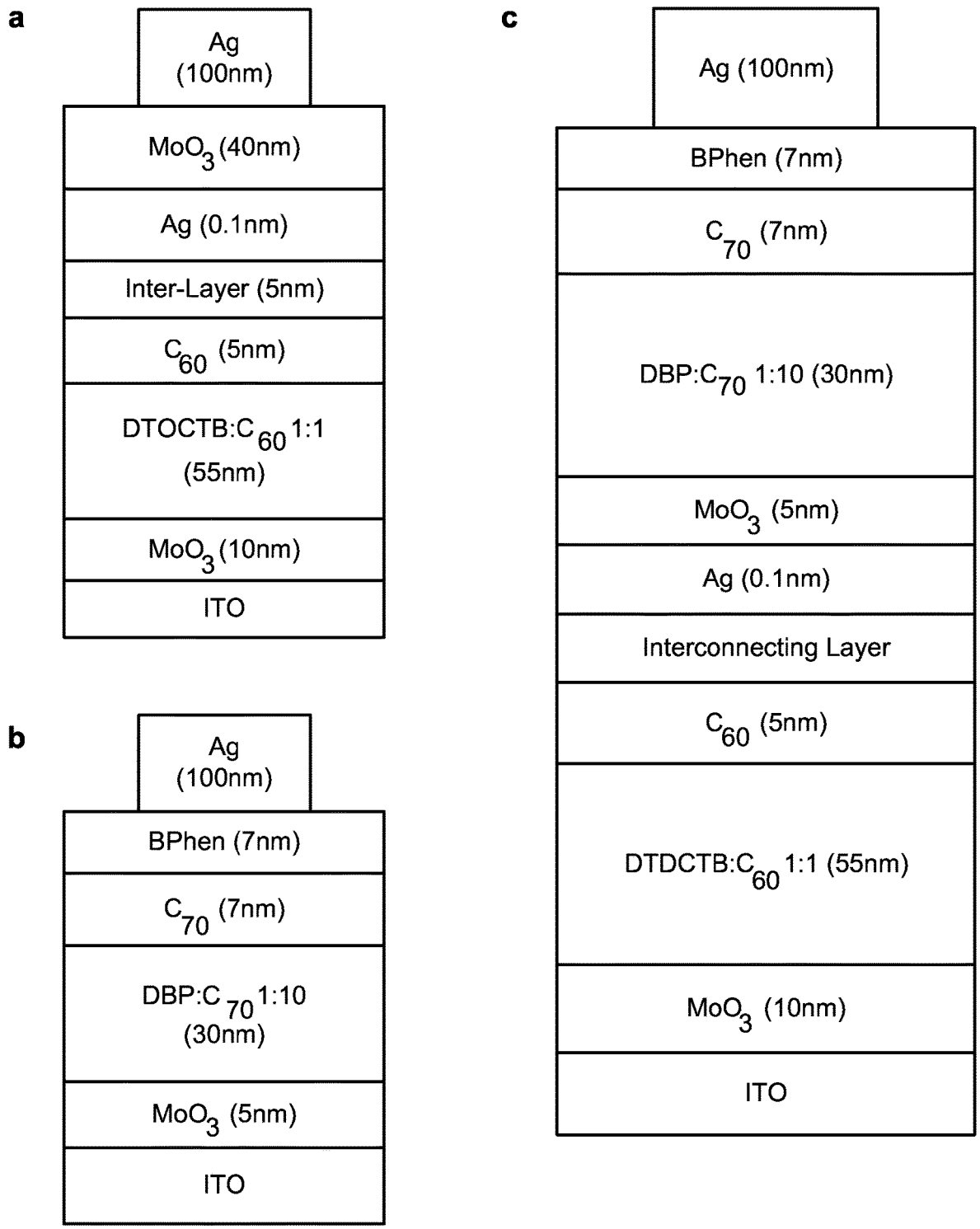
FIG. 2a shows an exemplary optimized front subcell.
FIG. 2b shows an exemplary optimized back subcell.
FIG. 2c shows an exemplary tandem solar cell device according to the present disclosure.
Figure 4A:
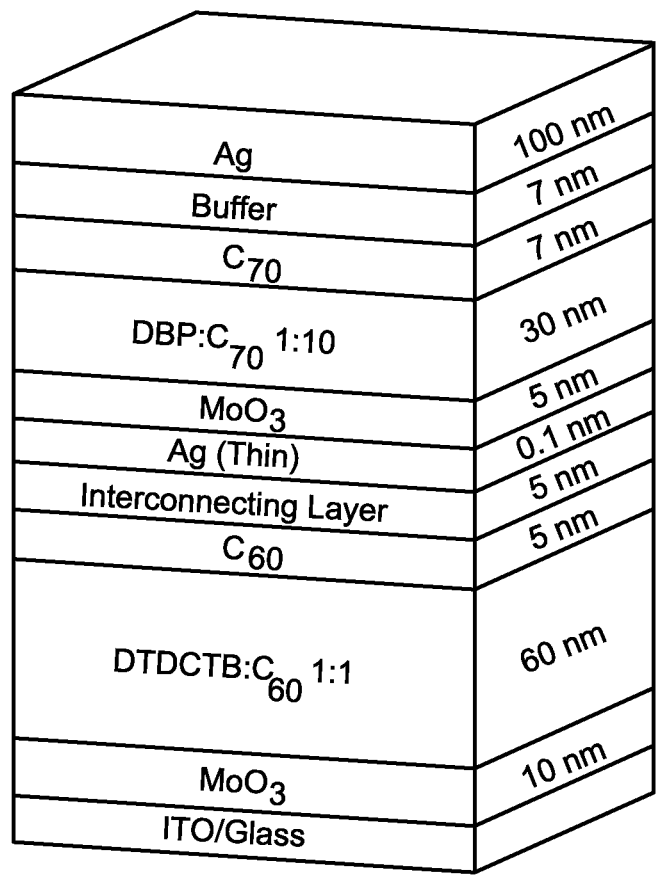
FIG. 4A shows an exemplary tandem solar cell device according to Example 1.

The tandem device is shown in FIG. 4A. To optimize the subcells, a single junction front-only cell approximating the DTDCTB:$C_{60}$ subcell was fabricated by inserting a 0.1 nm thick Ag layer, used for charge recombination and plasmonic field enhancement, followed by a 40 nm thick MoO$_3$ spacer located beneath the Ag contact. This is shown in FIG. 2a. Compared with the optimized single junction cell, the thickness of the neat $C_{60}$ layer was reduced from 20 nm to 5 nm to move the front cell closer to the cathode to increase the absorption by the active DTDCTB:$C_{60}$ layer and reduce the CT absorption of the $C_{60}$ layer. The optimized structure of the back subcell, shown in FIG. 2b, was: ITO/MoO$_3$ (5 nm)/DBP:$C_{70}$ (30 nm, 1:10 ratio by vol.)/$C_{70}$ (7 nm)/BPhen (7 nm)/Ag (100 nm), which resulted in $J_{SC}$=11.3±0.6 mA/cm$_2$ (M=1.00±0.01), $V_{OC}$=0.90±0.01 V, FF=0.61±0.01 and $\eta_P$=6.2±0.3%. The thickness of the DBP:$C_{70}$ mixed layer was increased in comparison to other iterations from 25 nm to 30 nm. This increased the back subcell absorption to match $J_{SC}$ with the front DTDCTB:$C_{60}$ subcell.

Figure 4B:
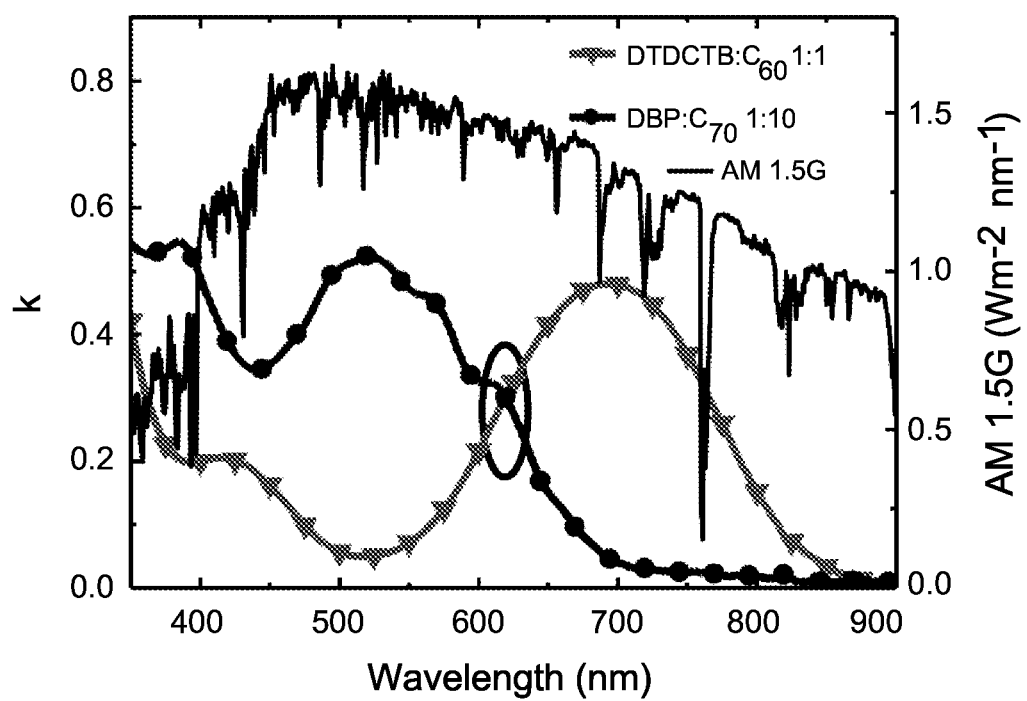
FIG. 4B shows the extinction coefficient of 1:1 DTDCTB:$C_{60}$ and 1:10 DBP:$C_{70}$ blends along with the AM 1.5G solar spectrum.

For the absorption ability of each subcell: the extinction coefficient of the 1:1 DTDCTB:$C_{60}$ and the 1:10 DBP:$C_{70}$ blends, along with the AM 1.5G solar spectrum, are shown in FIG. 4B. The DBP:$C_{70}$ film exhibited a broad spectral response at λ<700 nm (blue-yellow range), while the DTDCTB:$C_{60}$ layer primarily absorbs from λ=500 nm to 900 nm (red and NIR). Stacking these two subcells allowed absorption to span the wavelengths from λ=350 nm to 900 nm. This allowed coverage of a large portion of the solar spectrum with only minimal overlap between the constituent subcells. The tandem thus harvested light efficiently with good current match between subcells.

Figure 4C:
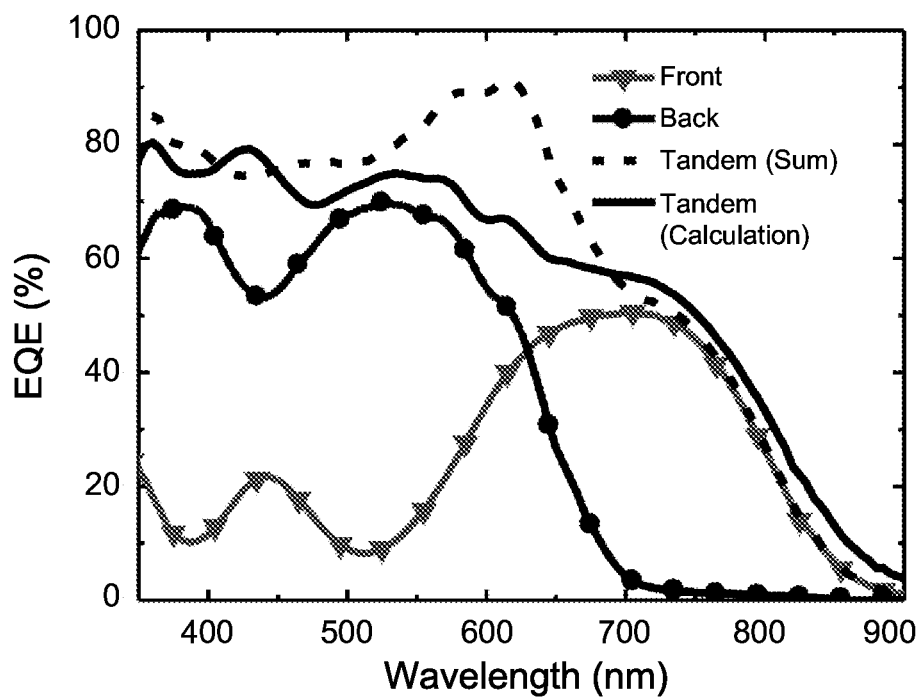
FIG. 4C shows the EQE spectrum of an exemplary cell with PTCBI used as the buffer layer interconnecting the front and back subcells.

FIG. 4C shows the EQE spectrum of the tandem OPV with the commonly used 3,4,9,10-perylenetetracarboxylic-bisbenzimidazole (PTCBI) used as the buffer layer interconnecting the front and back subcells. Both the measured EQEs of the subcells agreed with calculated DBP:$C_{70}$ subcell EQE>60% at λ<600 nm and calculated DTDCTB:$C_{60}$ subcell peak EQE=50% at λ=700 nm. Compared with previous small molecule tandems, the DTDCTB:$C_{60}$ front cell had a higher response in the orange-to-NIR spectral region and was nearly transparent at λ<500 nm. Thus the front cell with the NIR material leaves a "hole" space for blue-yellow light that allows the back subcell to absorb efficiently.

The black line in FIG. 4C shows the calculated EQE of the tandem cell. The sum of the measured EQE of the subcells is shown by a dashed line. The measured tandem cell EQE was higher than that measured for both individual component subcells and was nearly identical to their sum, with the exception of a <10% loss between λ=550 nm and 700 nm where the subcells exhibited a small absorption overlap. The tandem device performance parameters were: $J_{SC}$=9.2±0.4 mA/cm$^2$ (M=0.96±0.01), $V_{OC}$=1.72±0.01 V, FF=0.58±0.01. This resulted in an initial $\eta_P$=9.2±0.4%.

Figure 5A:
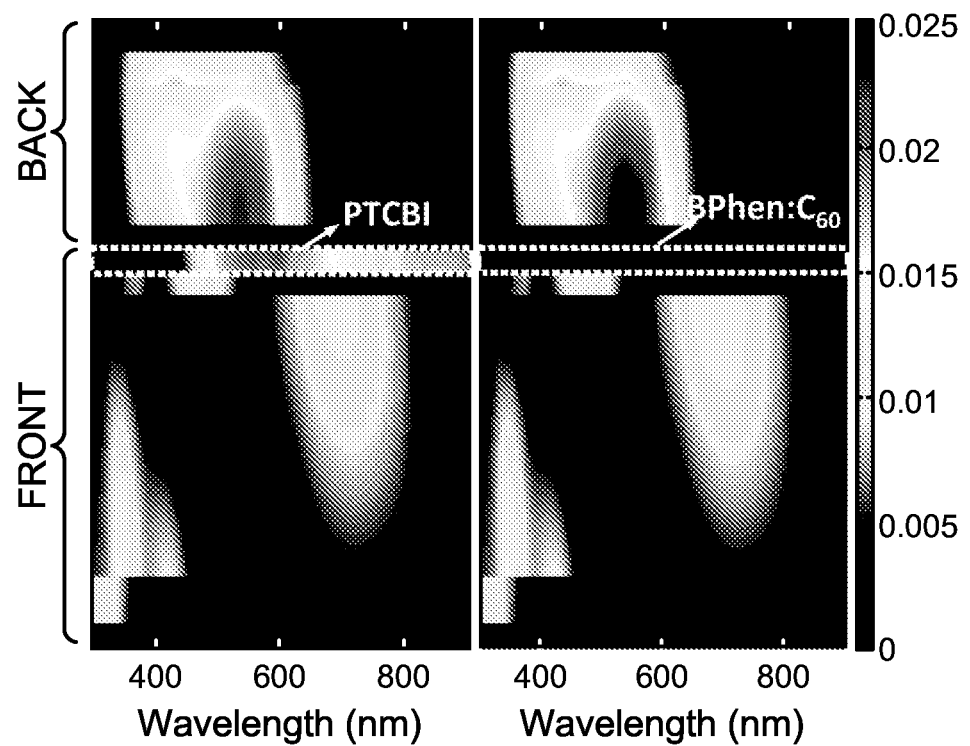
FIG. 5A shows the simulated optical field distribution within the exemplary tandem cell, comparing a 5 nm thick conventional PTCBI with a similarly thick BPhen:$C_{60}$ mixed buffer.

To improve device performance, the transparent exciton blocking and electron conducting BPhen:$C_{60}$ electron filter was used as the interconnect layer. FIG. 5A shows the simulated optical field distribution within the tandem cell, comparing a 5 nm thick conventional PTCBI with a similarly thick BPhen:$C_{60}$ mixed buffer. The lower portion is the front cell and the top portion is the back cell. The dashed rectangular region indicates the position of the interconnecting layer. As FIG. 5A shows, the BPhen:$C_{60}$ interconnecting layer is transparent, in striking contrast with the PTCBI buffer. The simulation also showed that both subcells fit within the first interference maximum of the optical field.

Figure 5B:
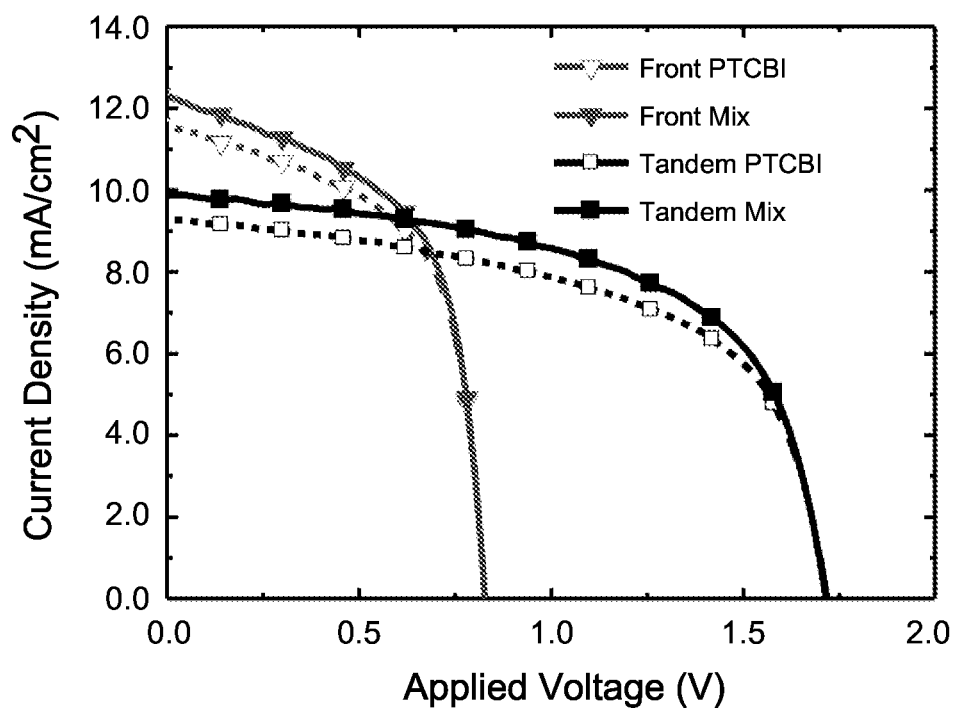
FIG. 5B shows the fourth quadrant J-V characteristics of an exemplary tandem and front cell utilizing PTCBI and BPhen:$C_{60}$ as the interconnecting layer.

FIG. 5B shows the fourth quadrant J-V characteristics of the tandem and front cell utilizing PTCBI and BPhen:$C_{60}$ as the interconnecting layer. As expected, when PTCBI was replaced with BPhen:$C_{60}$, $J_{SC}$ increased from 11.6±0.6 mA/cm$^2$ to 12.3±0.6 mA/cm$^2$ in the front subcell, with no significant change in FF. Hence, the efficiency of the front subcell increased from 5.7±0.3% to 6.0±0.3%. Additionally, as shown in FIG. 5A, the optical field in the DBP:$C_{70}$ subcell was enhanced when using BPhen:$C_{60}$ leading to a corresponding increase in current. Consequently, $J_{SC}$ of the tandem cell was increased to 9.9±0.5 mA/cm$^2$, whereas the $V_{OC}$ and FF remained unchanged.

Figure 6:
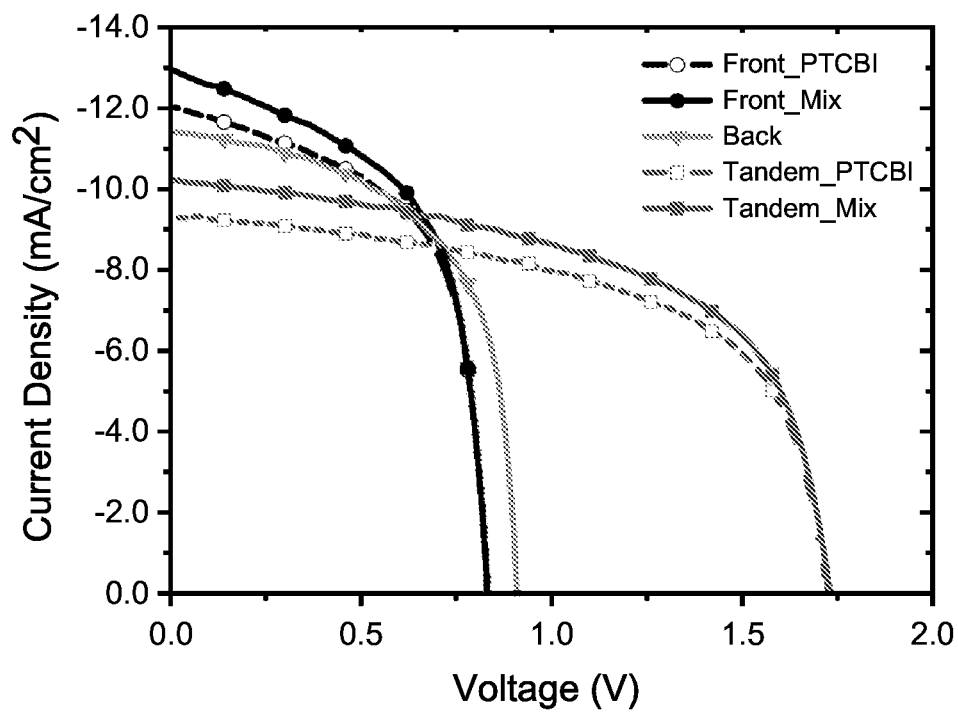
FIG. 6 shows the spectrally corrected J-V characteristics of an exemplary front cell, back cell, and tandem device.

FIG. 6 shows the fourth quadrant J-V characteristics results for another tandem cell with the DTDCTB:$C_{60}$ layer reduced by 5 mm (as in FIG. 2c). The tandem control cell with PTCBI had $J_{SC}$=9.3±0.4 mA/cm$^2$, $V_{OC}$=1.73±0.01 V, and FF=0.58±0.01%. The overall efficiency was 9.3±0.5% with a mismatch factor of 0.96. Compared with the control cell, the tandem cell with a BPhen:$C_{60}$ mixed buffer as the interconnecting layer has a higher $J_{SC}$ of 10.2±0.4 mA/cm$^2$, and $V_{OC}$=1.73±0.01 V (the same). Though the FF dropped to 0.56±0.01 compared with the former cell, the overall efficiency was increased to 9.9±0.5% owing to the increase in $J_{SC}$ being more than enough to compensate for the lower FF. The detailed data of the spectrally corrected parameters of different front, back and tandem cells is presented in Table 1.

TABLE 1

Spectrally corrected device performance of the front DTDCTB:$C_{60}$ PM-HJ cell, , the back DBP:$C_{70}$ PM-HJ subcell and Tandem cell with different interconnecting layers.

| Devices | $V_{OC}$ (V) | $J_{SC}$ (mA/cm$^2$) | FF | PCE (%) AM 1.5 G | M |
|---|---|---|---|---|---|
| Front (PTCBI) | 0.83 ± 0.01 | 11.9 ± 0.6 | 0.59 ± 0.01 | 5.8 ± 0.2 | 0.93 |
| Front (BPhen:$C_{60}$) | 0.83 ± 0.01 | 12.8 ± 0.6 | 0.57 ± 0.01 | 6.1 ± 0.3 | 0.92 |
| Back | 0.90 ± 0.01 | 11.3 ± 0.5 | 0.60 ± 0.01 | 6.1 ± 0.3 | 1.00 |
| Tandem (PTCBI) | 1.73 ± 0.01 | 9.3 ± 0.4 | 0.58 ± 0.01 | 9.3 ± 0.5 | 0.96 |

TABLE 1-continued

Spectrally corrected device performance of the front
DTDCTB:$C_{60}$ PM-HJ cell, , the back DBP:$C_{70}$ PM-HJ subcell
and Tandem cell with different interconnecting layers.

| Devices | $V_{OC}$ (V) | $J_{SC}$ (mA/cm$^2$) | FF | PCE (%) AM 1.5 G | M |
|---|---|---|---|---|---|
| Tandem (BPhen:$C_{60}$) | 1.73 ± 0.01 | 10.2 ± 0.4 | 0.56 ± 0.01 | 9.9 ± 0.5 | 0.95 |

A thin layer of silver was also employed in between the two cells to act as a recombination center of electrons and holes in order to make the current flow. Using BPhen:$C_{60}$ as an interconnecting layer along with Ag nanoparticles as a charge recombination layer, optical modelling suggested that the optimized tandem cell should employ a front subcell mixed layer thickness of 55 nm to 60 nm, and a back subcell thickness between 30 nm and 35 nm. The resulting experimental cell, whose structure and optimized layer thicknesses are shown in FIG. 4A matched the modeled performance summarized in Table 1.

Figure 7A:
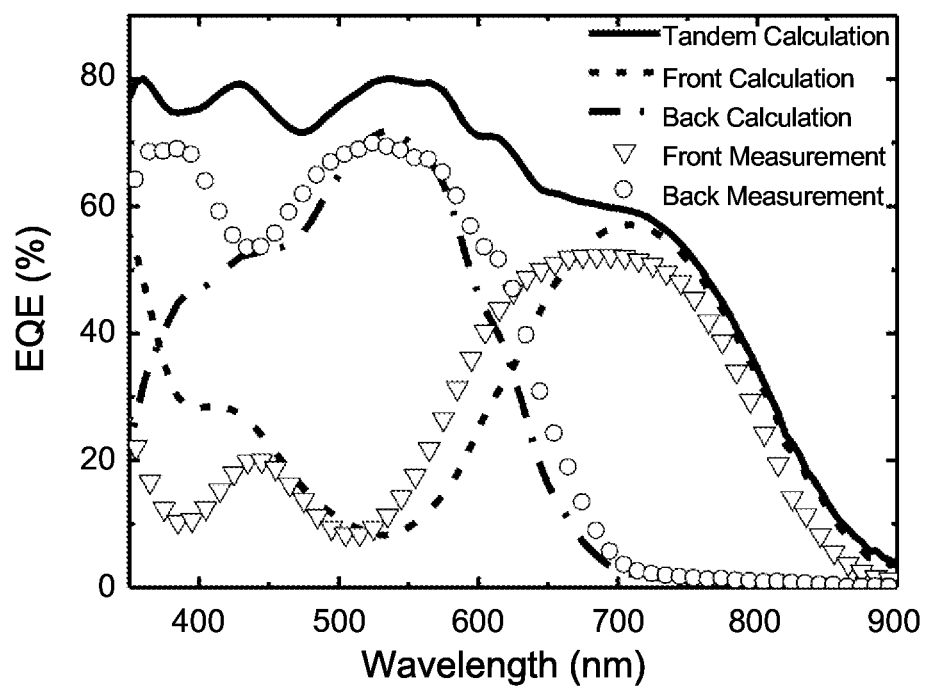
FIG. 7A shows both simulated and measured optimized tandem cell EQEs of the exemplary tandem device of Example 1.

The optimized tandem cell EQEs, both simulated and measured, are shown in FIG. 7A. The optimized tandem cell EQE using a BPhen:$C_{60}$ interconnecting layer is similar to that of the tandem employing a conventional PTCBI buffer, although the measured front subcell peak EQE increased from 50% to 53% (Compare FIG. 4C). The solid black line, showing the modeled EQE of the tandem cell, shows a fairly evenly distributed conversion efficiency over the visible and NIR spectrum.

Figure 7B:
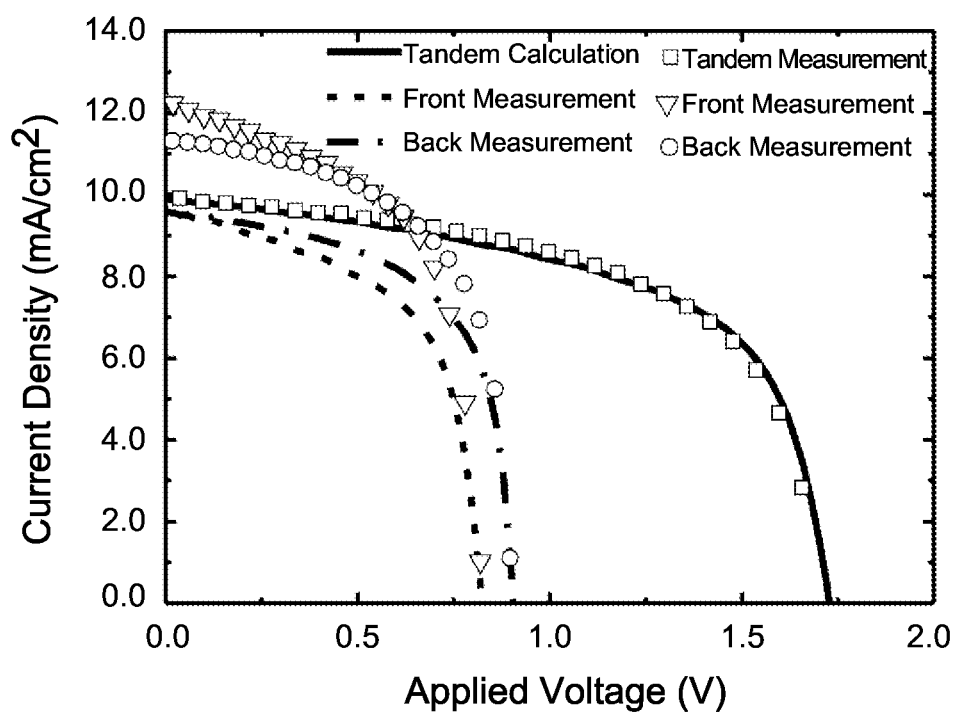
FIG. 7B shows the measured and calculated 4th quadrant J-V characteristics of the exemplary tandem device of Example 1.

FIG. 7B shows the measured and calculated 4th quadrant J-V characteristics. The experimental characteristics of the individual subcells were measured at 100 mW/cm$^2$ where both have an efficiency of ~6.0%. The calculated tandem J-V characteristics agreed with the measurements, suggesting that the models of the optical field distribution and the charge collection are predictive of performance, thereby simplifying future device layer thickness design. The optimized tandem OPV cell achieved $J_{SC}$=9.9±0.5 mA/cm$^2$ (M=0.95±0.01), $V_{OC}$=1.72±0.01 V, FF=0.59±0.01, with $\eta_P$=10.0±0.5%. This represented an approximately 60% improvement over the discrete cell efficiencies comprising the stack. Furthermore, the tandem $V_{OC}$ was equal to the sum of the constituent sub-cells, suggesting that the interconnecting charge recombination layer used was lossless.

Figure 8A:
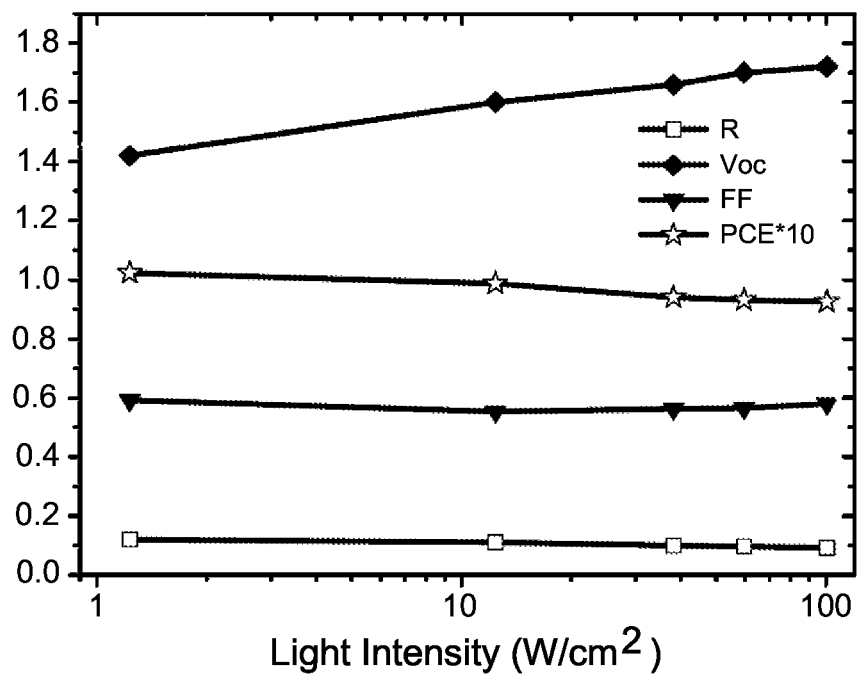
FIG. 8A shows performance parameters under different light intensities for the exemplary tandem with PTCBI as the interconnecting layer.
Figure 8B:
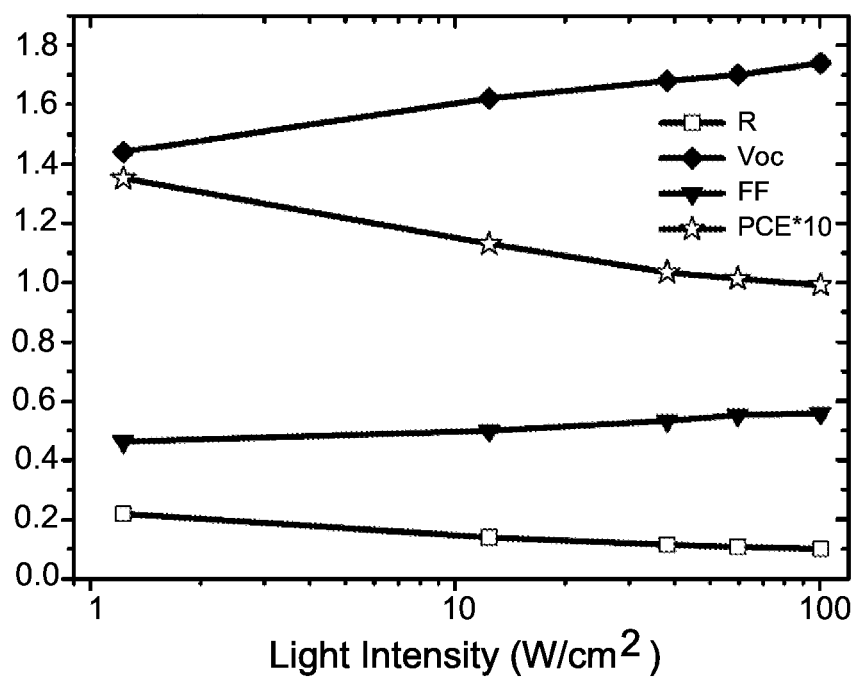
FIG. 8B shows performance parameters under different light intensities for the exemplary tandem with BPhen:$C_{60}$ as the interconnecting layer.

FIG. 8 shows the device performance parameters under different light intensities. FIG. 8A depicts the performance of the tandem with PTCBI and 8B shows the that of the tandem with BPhen:$C_{60}$ as the interconnecting layer. In both cases, $V_{OC}$ increased linearly with increasing light intensity. FF also had an upward trend. The photo responsivity decrease with increasing light intensity, however, caused an overall decreasing trend of power conversion efficiency. It is also worth noting that the efficiency of the tandem device with PTCBI decreases more slowly than that of the BPhen:$C_{60}$.

Example 2: High Intensity with DTDCTB:$C_{60}$ and DBP:$C_{70}$ Subcells

It has been shown that optimized tandem structures employ subcells whose currents are approximately matched at the maximum power point (MPP) of operation. The power conversion efficiency penalty that is related to any mismatch in constituent subcell efficiencies is defined as:

$$\Delta\eta=1-(J_{MT}V_{MT})/(J_{M1}V_{M1}+J_{M2}V_{M2})$$

The optimal design corresponds to $\Delta\eta$=0. Here, $J_M$ and $V_M$ refer to the current density and voltage at the MPP. The subscript T refers to the tandem, and 1,2 refer to the two subcells. According to the simulated J-V characteristics of the subcells in FIG. 7B, the optimized tandem device in the previous example embodiment has $\Delta\eta$=0.6%. This is close to the ideal scenario where $J_{MT}$=$J_{M1}$=$J_{M2}$ and $M_{MT}$=$V_{M1}$=$V_{M2}$.

In one further tandem cell structure, the BPhen cathode buffer (7 nm, below the AG contact) was replaced with a high electron conductivity, exciton blocking compound BPhen:$C_{60}$ (5 nm)/BPhen (2 nm) electron filter that reduces bimolecular recombination at the buffer/acceptor interface. The electron filter increased $\eta_P$ of the back cell, but also increased the FF and $J_{SC}$ differences between the sub-cells, which ultimately caused a larger mismatch. The tandem efficiency was 9.6±0.5%, since $J_{SC}$ decreased to 9.0±0.4 mA/cm$^2$. The current mismatch resulted in $\Delta\eta$=4.8%; a slight reduction in efficiency from the tandem device in Example 1. The reduced tendency for bimolecular recombination and exciton-polaron quenching suggested, however, that the use of this compound buffer could result in improved response at high intensity.

Figure 9:
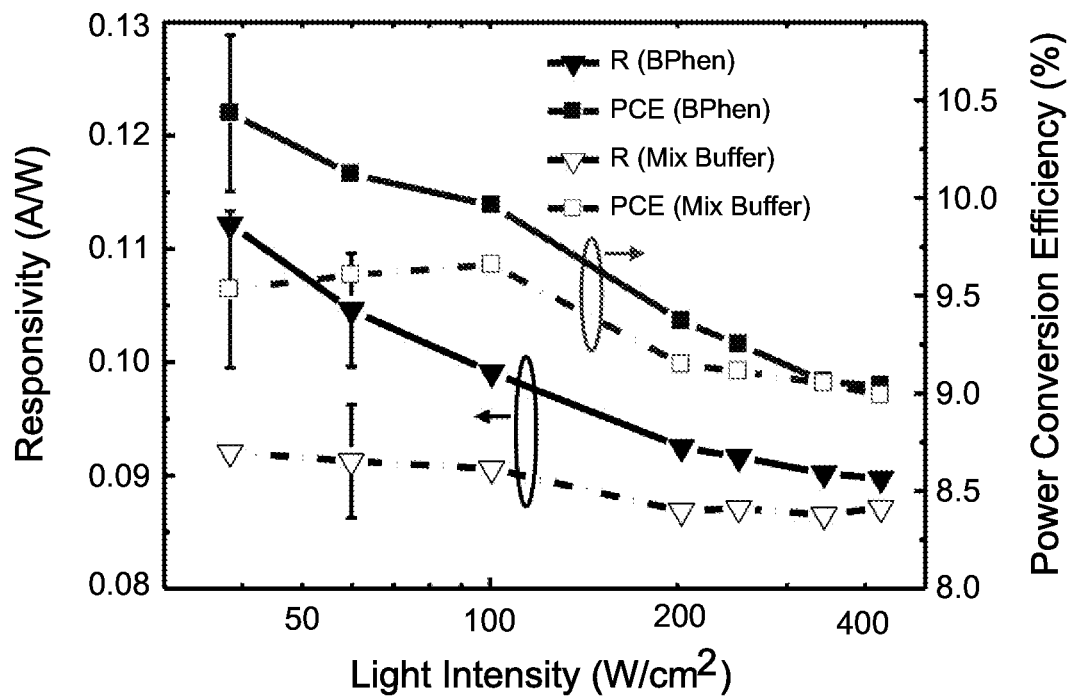
FIG. 9 shows the results of measuring the responsivity and rip of the exemplary tandem solar cells of Example 2, with BPhen or BPhen:$C_{60}$/BPhen as the cathode buffer layers with intensities ranging from 0.2 to 4 suns.

Thus, the responsivity and $\eta_P$ of the tandem solar cells was measured, with BPhen or BPhen:$C_{60}$/BPhen as the cathode buffer layers with intensities ranging from 0.2 to 4 suns. The results are shown in FIG. 9. The responsivity of the tandem cell with BPhen decreases from 0.112±0.005 NW to 0.090±0.004 A/W, while the tandem with the mixed buffer shows only a minor (5%) change from 0.092±0.004 NW to 0.087±0.004 A/W. The tandem cell with the mixed cathode buffer shows no efficiency change up to 1 sun intensity, after which it decreases due to series resistance. At 4 suns, both solar cells exhibit a power conversion efficiency of 9.0%. Accordingly, use of the mixed cathode buffer in the form of BPhen:$C_{60}$/BPhen may be preferred in applications involving high intensities.

Example 3: DTDCTB:$C_{60}$ and DTDCPB:$C_{70}$ Subcells

As further embodied herein, a small molecule tandem solar cell may be formed with a front subcell and a back subcell. The front subcell adjacent to the transparent anode may comprise the primarily orange-to-NIR absorbing donor, (DTDCTB) blended with $C_{60}$ (DTDCTB:$C_{60}$). The front subcell may be paired with a UV-to-yellow absorbing (2-[(7-{4-[N,N-Bis(4-methylphenyl)amino]phenyl}-2,1,3-benzothiadiazol-4-yl)methylene]propanedinitrile (DTDCPB) mixed with $C_{70}$ (DTDCPB:$C_{70}$) back subcell. The chemical structure of DTDCPB is shown in FIG. 10.

In the front subcell, the $C_{60}$ intermolecular charge transfer (CT) absorption feature in the green is greatly reduced when diluted in DTDCTB, thus providing a spectrally complimentary system with the back sub-cell. The resulting tandem solar cell broadly covers the solar spectrum from λ=350 nm to 900 nm, achieving a simulated efficiency of 9.8% under standard illumination. The high efficiency again utilizes the principle of non-overlapping spectral sensitivity between subcells that is unique to excitonic cells, along with a nearly optically lossless BPhen:$C_{60}$ electron filtering layer connecting the subcells.

Figure 12:
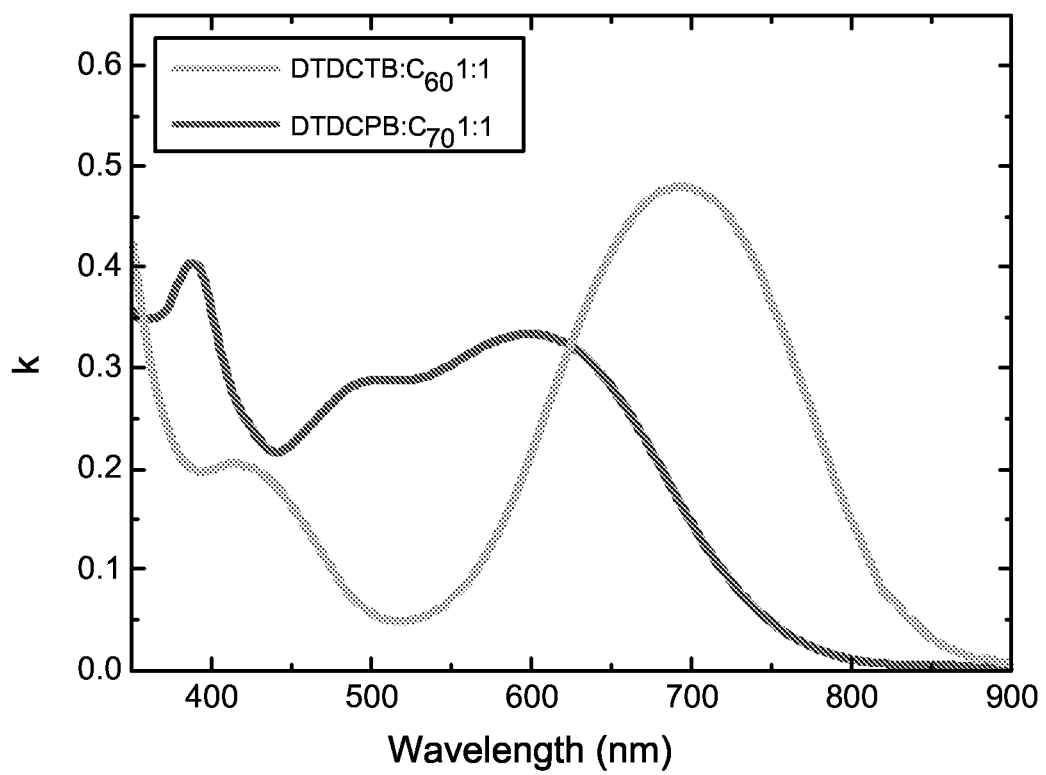
FIG. 12 shows the extinction coefficient of 1:1 DTDCTB:$C_{60}$ and the 1:1 DTDCPB:$C_{70}$ blends along with the AM 1.5G solar spectrum.

The tandem device is shown in FIG. 11. For the absorption ability of each subcell: the extinction coefficient of the 1:1 DTDCTB:$C_{60}$ and the 1:1 DTDCPB:$C_{70}$ blends, along with the AM 1.5G solar spectrum, are shown in FIG. 12. The DTDCPB:$C_{70}$ film exhibits a broad spectral response at λ<700 nm (blue-yellow range), while the DTDCTB:$C_{60}$ layer primarily absorbs from λ=500 nm to 900 nm (red and NIR). Stacking these two subcells allowed absorption to span the wavelengths from λ=350 nm to 900 nm. This allowed coverage of a large portion of the solar spectrum with only minimal overlap between the constituent subcells. The tandem thus harvested light efficiently with good current match between subcells.

Figure 13:
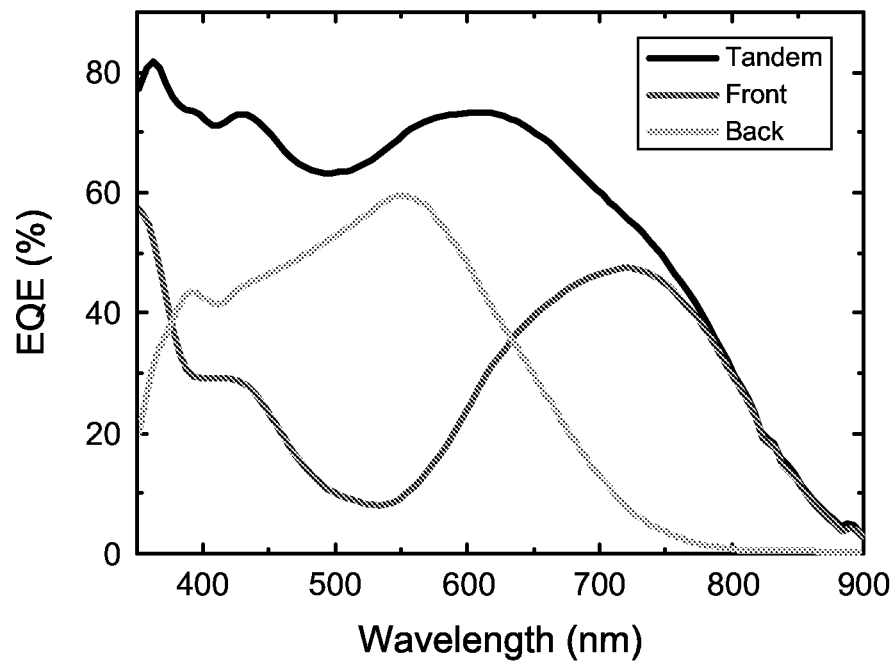
FIG. 13 shows the simulated EQE spectrum of the exemplary tandem device of Example 3.

FIG. 13 shows the simulated EQE spectrum of the tandem OPV. As before, the DTDCTB:$C_{60}$ front cell has a higher response in the orange-to-NIR spectral region and is nearly transparent at λ<500 nm. Thus the front cell with the NIR material laves a "hole" space for blue-yellow light that allows the back subcell to absorb efficiently. The black line in FIG. 13 shows the calculated EQE of the tandem cell. The tandem device's calculated performance parameters are: $J_{SC}$=9.1 mA/cm$^2$ $V_{OC}$=1.72, FF=0.62. This results in an $\eta_P$=9.8%.

Figure 14:
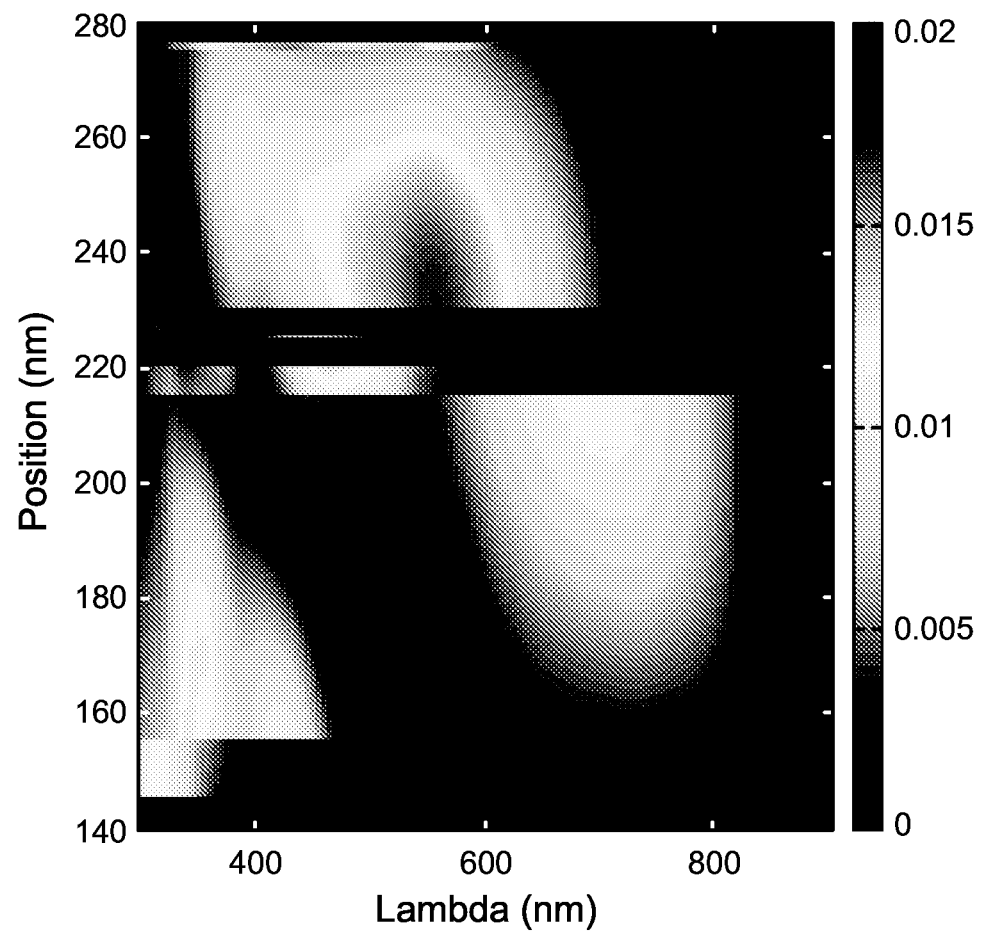
FIG. 14 shows the simulated optical field distribution within the exemplary tandem cell of Example 3 with a 5 nm thick BPhen:$C_{60}$ mixed buffer.

To improve device performance, the transparent exciton blocking and electron conducting BPhen:$C_{60}$ electron filter is again used as the interconnect layer. FIG. 14 shows the simulated optical field distribution within the tandem cell with a 5 nm thick BPhen:$C_{60}$ mixed buffer. As shown, the BPhen:$C_{60}$ interconnecting layer is transparent, allowing the light from the front cell to pass unabsorbed to the back cell.

Figure 15:
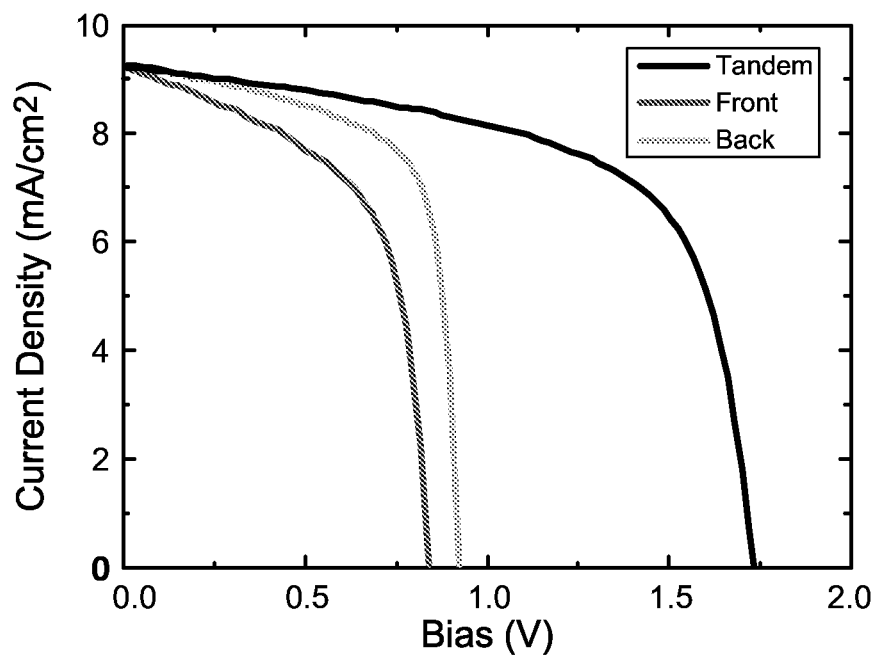
FIG. 15 shows the fourth quadrant J-V characteristics of the front subcell, back subcell, and tandem of the exemplary device of Example 3.

FIG. 15 shows the fourth quadrant J-V characteristics of the tandem, front, and back cell of this example. The detailed data of the spectrally corrected parameters of different front, back and tandem cells is presented in Table 2. The optimized tandem cell efficiency of 9.8% represents a significant improvement over the individual cells comprising the stack, as shown in Table 2. Furthermore, the tandem $V_{OC}$ is equal to the sum of the constituent sub-cells, suggesting that the interconnecting charge recombination layer used was lossless.

TABLE 2

| Cells | $J_{SC}$ (mA/cm$^2$) | $V_{OC}$ (V) | FF | PCE (%) |
|---|---|---|---|---|
| Front | 9.1 | 0.82 | 0.57 | 4.3 |
| Back | 9.1 | 0.90 | 0.68 | 5.6 |
| Tandem | 9.1 | 1.72 | 0.62 | 9.8 |

What is claimed is:

1. A tandem photovoltaic device comprising:
a first subcell comprising a first photoactive region;
a second subcell comprising a second photoactive region; and
a separating layer between the first subcell and the second subcell, wherein the separating layer comprises an interconnecting layer comprising bathophenanthroline (BPhen):$C_{60}$;
wherein:
the first photoactive region comprises a first donor material and a first acceptor material forming a first donor-acceptor heterojunction;
the second photoactive region comprises a second donor material and a second acceptor material forming a second donor-acceptor heterojunction;
the first donor material comprises 2-((7-(5-(dip-tolylamino)thiophen-2-yl)benzo[c] [1,2,5]thiadiazol-4-yl)methylene)malononitrile (DTDCTB) or a derivative thereof;
the first acceptor material comprises $C_{60}$;
the second donor material comprises dibenzo([f,f']-4,4',7,7'-tetraphenyl)diindeno[1,2,3-cd:1',2',3'-lm]perylene (DBP) or a derivative thereof;
the second acceptor material comprises $C_{70}$; and
the first subcell is the front subcell and the second subcell is the back subcell, such that incident light enters the device through the first subcell and light that is not absorbed by the first subcell is passed to the second subcell.

2. The tandem photovoltaic device of claim 1, wherein the first donor-acceptor heterojunction is chosen from a mixed heterojunction and a hybrid planar-mixed heterojunction.

3. The tandem photovoltaic device of claim 1, wherein the second donor-acceptor heterojunction is chosen from a mixed heterojunction and a hybrid planar-mixed heterojunction.

4. The tandem photovoltaic device of claim 1, wherein the first and second donor-acceptor heterojunctions are chosen from mixed heterojunctions and hybrid planar-mixed heterojunctions.

5. The tandem photovoltaic device of claim 1, wherein the second donor material comprises DBP.

6. The tandem photovoltaic device of claim 5, wherein the first donor material comprises DTDCTB.

7. The tandem photovoltaic device of claim 1, wherein the separating layer further comprises a charge recombination layer.

8. The tandem photovoltaic device of claim 7, wherein the charge recombination layer comprises a material chosen from Al, Ag, Li, LiF, Sn, and Ti.

9. The tandem photovoltaic device of claim 7 further comprising a charge collecting layer between the separating layer and one of the first and second photoactive regions, wherein the charge collecting layer comprises a metal oxide.

10. The tandem photovoltaic device of claim 9, wherein the metal oxide is chosen from $MoO_3$, $V_2O_5$, ZnO, and $TiO_2$.

11. The tandem photovoltaic device of claim 1, wherein the first donor material comprises DTDCTB.

* * * * *